(12) United States Patent
Persons

(10) Patent No.: US 7,408,337 B2
(45) Date of Patent: Aug. 5, 2008

(54) COMPENSATING FOR LOSS IN A TRANSMISSION PATH

(75) Inventor: Thomas W. Persons, Los Altos, CA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 11/265,525

(22) Filed: Nov. 2, 2005

(65) Prior Publication Data

US 2006/0273781 A1 Dec. 7, 2006

Related U.S. Application Data

(60) Provisional application No. 60/687,398, filed on Jun. 3, 2005.

(51) Int. Cl.
*G01R 31/26* (2006.01)

(52) U.S. Cl. .................................. 324/158.1; 324/73.1

(58) Field of Classification Search ....................... None
See application file for complete search history.

(56) References Cited

U.S. PATENT DOCUMENTS

| | | | | |
|---|---|---|---|---|
| 5,898,326 | A | * | 4/1999 | Okayasu ...................... 327/112 |
| 6,360,180 | B1 | * | 3/2002 | Breger ......................... 702/108 |
| 7,174,143 | B1 | * | 2/2007 | Turvey ..................... 455/226.1 |

OTHER PUBLICATIONS

International Search Report for Application No. PCT/US2006/16940.
Written Opinion for Application No. PCT/US2006/16940.

* cited by examiner

*Primary Examiner*—Minh N. Tang
(74) *Attorney, Agent, or Firm*—Fish & Richardson P.C.

(57) ABSTRACT

An apparatus to compensate for loss in a transmission path includes a circuit block that incorporates time constants into a signal transmitted via the transmission path. The time constants counteract at least part of inherent time constants that contribute to loss in the transmission path. The circuit block includes a resistive circuit and a capacitive circuit. The capacitive circuit and the resistive circuit together contribute to the time constants. The capacitive circuit includes plural capacitors that are each switchable via the circuit block. An amount of compensation provided by the apparatus corresponds, at least in part, to the loss in the transmission path.

41 Claims, 5 Drawing Sheets

COMPENSATING FOR LOSS IN A TRANSMISSION PATH

CROSS-REFERENCE TO RELATED APPLICATION

This patent application claims priority to U.S. Provisional Application No. 60/687,398, filed on Jun. 3, 2005, the contents of which are hereby incorporated by reference into this application as if set forth herein in full.

TECHNICAL FIELD

This patent application relates generally to compensating for losses that occur in a transmission path and, more particularly, to automatic test equipment that includes circuitry for compensating for such losses.

BACKGROUND

High-speed signals have a tendency to travel on the outer edge, or "skin", of a conductor. Thus, the cross-sectional area of the conductor that is used to transmit the signals is reduced. Because less conductor is used, the transmission path is, effectively, more resistive. The resistance here is referred to as the "skin resistance". Losses in the signal that results from the skin resistance are referred to as "skin losses".

Skin losses become more prevalent as signal frequencies increase, and can have various deleterious effects on the signal. For example, skin losses can cause attenuation in the signal, which effectively results in a narrowing of signal pulses. In a square wave signal, such as a digital signal, the attenuation can cause a rounding of the signal. For example, as shown in FIG. 1, skin losses can transform original, complementary square-wave digital signals 5 into signals 7 having rounded edges. This results in a narrowing of pulse widths in the signals, thereby adversely affecting timing. In some cases, amplitude attenuation can be significant enough to prevent the signals from reaching a threshold required to register a change from a logic zero to a logic one.

Problems resulting from skin loss can occur in automatic test equipment (ATE). In this context, ATE is an automated, usually computer-driven, system for testing devices, such as semiconductors, electronic circuits, and printed circuit board assemblies. A device tested by ATE is referred to as a device under test (DUT).

ATE is capable of providing different types of signals to a DUT. Among these signals are test signals, which are used to test the DUT. The test signals may include analog signals and digital signals used to test and/or program the DUT. Heretofore, ATE provided a fixed loss compensation to counteract skin losses that occurred during transmission of signals between the ATE and the DUT. One problem with fixed loss compensation, however, is that it does not take into account that different signal transmission paths have different lengths, resulting in different amounts of loss. Circuit board traces, for example, can account for the differing lengths of a transmission path. Fixed loss compensation can under-compensate for skin losses and, in other cases, it can over-compensate for skin losses.

SUMMARY

This patent application describes methods and apparatus, including computer program products, for providing adjustable loss compensation in a transmission path.

In general, in one aspect, the invention is directed to an apparatus to compensate for loss in a transmission path, which includes a circuit block that incorporates time constants into a signal transmitted via the transmission path. The time constants counteract at least part of inherent time constants that contribute to loss in the transmission path. The circuit block includes a resistive circuit and a capacitive circuit. The capacitive circuit and the resistive circuit together contribute to the time constants. The capacitive circuit includes plural capacitors that are each switchable. An amount of compensation provided by the apparatus corresponds, at least in part, to the loss in the transmission path. This aspect may include one or more of the following features.

The circuit block is a first circuit block and the time constant introduced by the first circuit block is a first time constant. The apparatus includes N (N≧1) circuit blocks, each of which introduces an $N^{th}$ time constant, such that the first time constant and N time constant(s) together counteract at least part of the inherent time constants. An $M^{th}$ (1≦M≦N) circuit block comprises an $M^{th}$ resistive circuit and an $M^{th}$ capacitive circuit. The $M^{th}$ capacitive circuit and the $M^{th}$ resistive circuit together contribute to an $M^{th}$ time constant introduced by the $M^{th}$ circuit block. The $M^{th}$ capacitive circuit comprises plural capacitors that are each switchable.

The plural capacitors may be binary-weighted capacitors arranged in parallel. The binary-weighted capacitors may be switchable between an output transistor and ground. The binary-weighted capacitors may include three binary-weighted capacitors. A first of the binary-weighted capacitors may have a capacitance of C, a second of the binary-weighted capacitors may have a capacitance of 2C, and a third of the binary-weighted capacitors may have a capacitance of 4C. The resistive circuit and the capacitive circuit may be connected in series. The resistive circuit may be a resistor and the capacitive circuit may include capacitors connected in parallel. The transmission path may be comprised of one or more of a trace on a circuit board and wiring that is not part of the circuit board. The loss in the transmission path may cause rounding of peaks and timing errors in the signal transmitted along the transmission path. The compensation provided by the apparatus may counteract the rounding and timing errors at least partially.

The apparatus may include a first emitter-follower-transistor connected to the circuit block and connected through a gain resistor to another emitter-follower to act as a amplifier. A frequency response of the amplifier may be adjustable via switchable time constants in parallel with the gain resistor. The transmission path may be at least part of a signal path between automatic test equipment (ATE) and a device under test (DUT).

In general, in another aspect, the invention is directed to a method performed by the foregoing apparatus. This method aspect may include any one or more of the foregoing features.

The details of one or more examples are set forth in the accompanying drawings and the description below. Further features, aspects, and advantages of the invention will become apparent from the description, the drawings, and the claims.

DESCRIPTION OF THE DRAWINGS

Like reference numerals in different figures indicate like elements.

DETAILED DESCRIPTION

Figure 1:
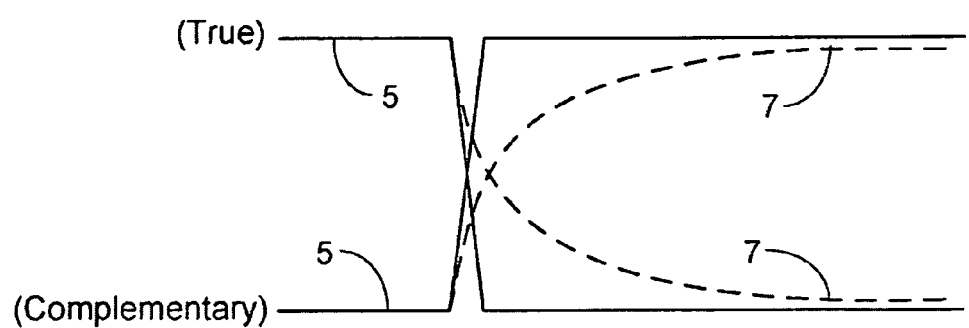
FIG. 1 is a graph showing effects of skin loss on a digital signal.
Figure 2:
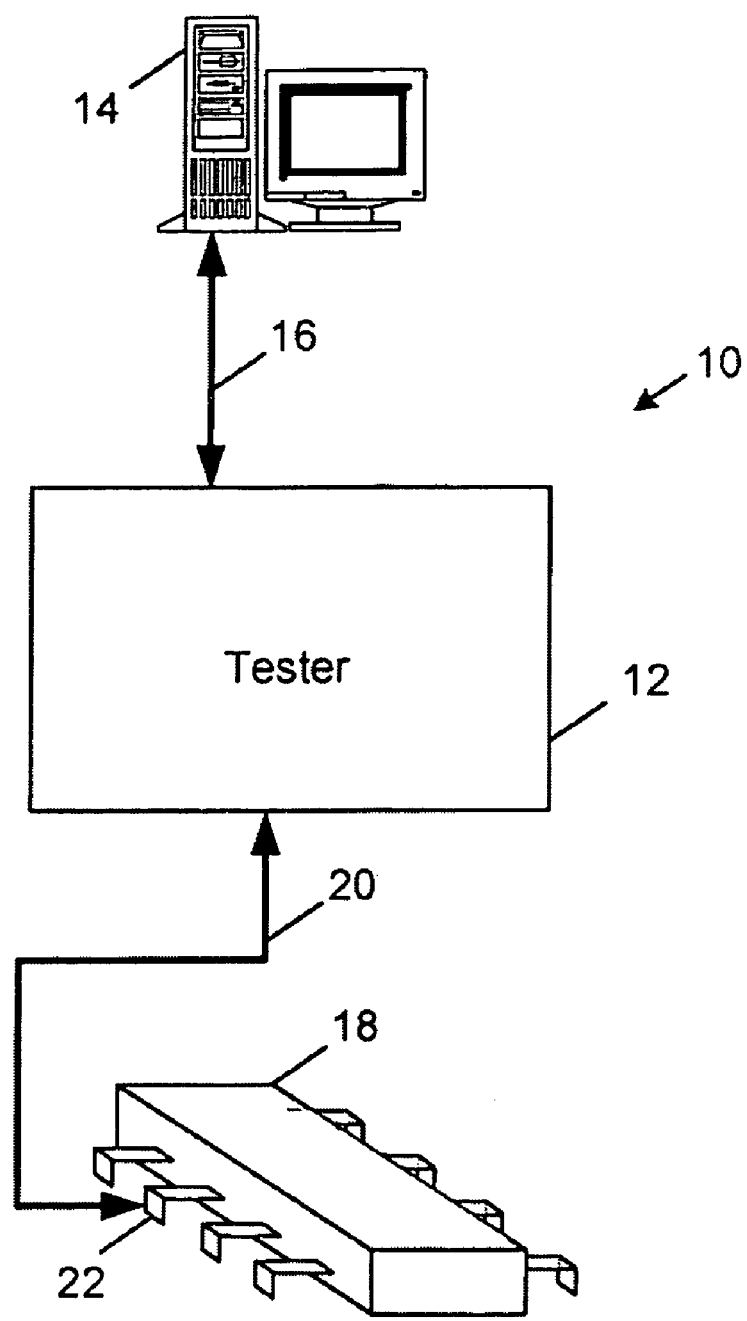
FIG. 2 is a block diagram of ATE for testing devices.

Referring to FIG. 2, a system 10 for testing a device-under-test (DUT) 18, such as a semiconductor device, includes a tester 12 such as automatic test equipment (ATE) or other similar testing device. To control tester 12, system 10 includes a computer system 14 that interfaces with tester 12 over a hardwire connection 16. Typically, computer system 14 sends commands to tester 12 that initiate the execution of routines and functions for testing DUT 18. Such executing test routines may initiate the generation and transmission of test signals to the DUT 18 and collection of responses from the DUT. Various types of DUTs may be tested by system 10. For example, DUTs may be semiconductor devices, such as an integrated circuit (IC) chip (e.g., memory chip, microprocessor, analog-to-digital converter, digital-to-analog converter, etc.).

To provide test signals and collect responses from the DUT, tester 12 is connected to one or more connector pins that provide an interface for the internal circuitry of DUT 18. To test some DUTs, e.g., as many as sixty-four or one hundred twenty-eight connector pins (or more) may be interfaced to tester 12. For illustrative purposes, in this example, semiconductor device tester 12 is connected to one connector pin of DUT 18 via a hardwire connection. A conductor 20 (e.g., cable) is connected to pin 22 and is used to deliver test signals (e.g., PMU test signals, PE-test signals, etc.) to the internal circuitry of DUT 18. Conductor 20 also senses signals at pin 22 in response to the test signals provided by semiconductor device tester 12. For example, a voltage signal or a current signal may be sensed at pin 22 in response to a test signal and sent over conductor 20 to tester 12 for analysis. Such single port tests may also be performed on other pins included in DUT 18. For example, tester 12 may provide test signals into other pins and collect associated signals reflected back over conductors (that deliver the provided signals). By collecting the reflected signals, the input impedance of the pins may be characterized, along with other single port testing quantities. In other test scenarios, a digital signal may be sent over conductor 20 to pin 22 for storing a digital value on DUT 18. Once stored, DUT 18 may be accessed to retrieve and send the stored digital value over conductor 20 to tester 12. The retrieved digital value may then be identified to determine if the proper value was stored on DUT 18.

Along with performing one-port measurements, a two-port test may also be performed by semiconductor device tester 12. For example, a test signal may be injected over conductor 20 into pin 22 and a response signal may be collected from one or more other pins of DUT 18. This response signal may be provided to semiconductor device tester 12 to determine such quantities as gain response, phase response, and other throughput measurement quantities.

Figure 3:
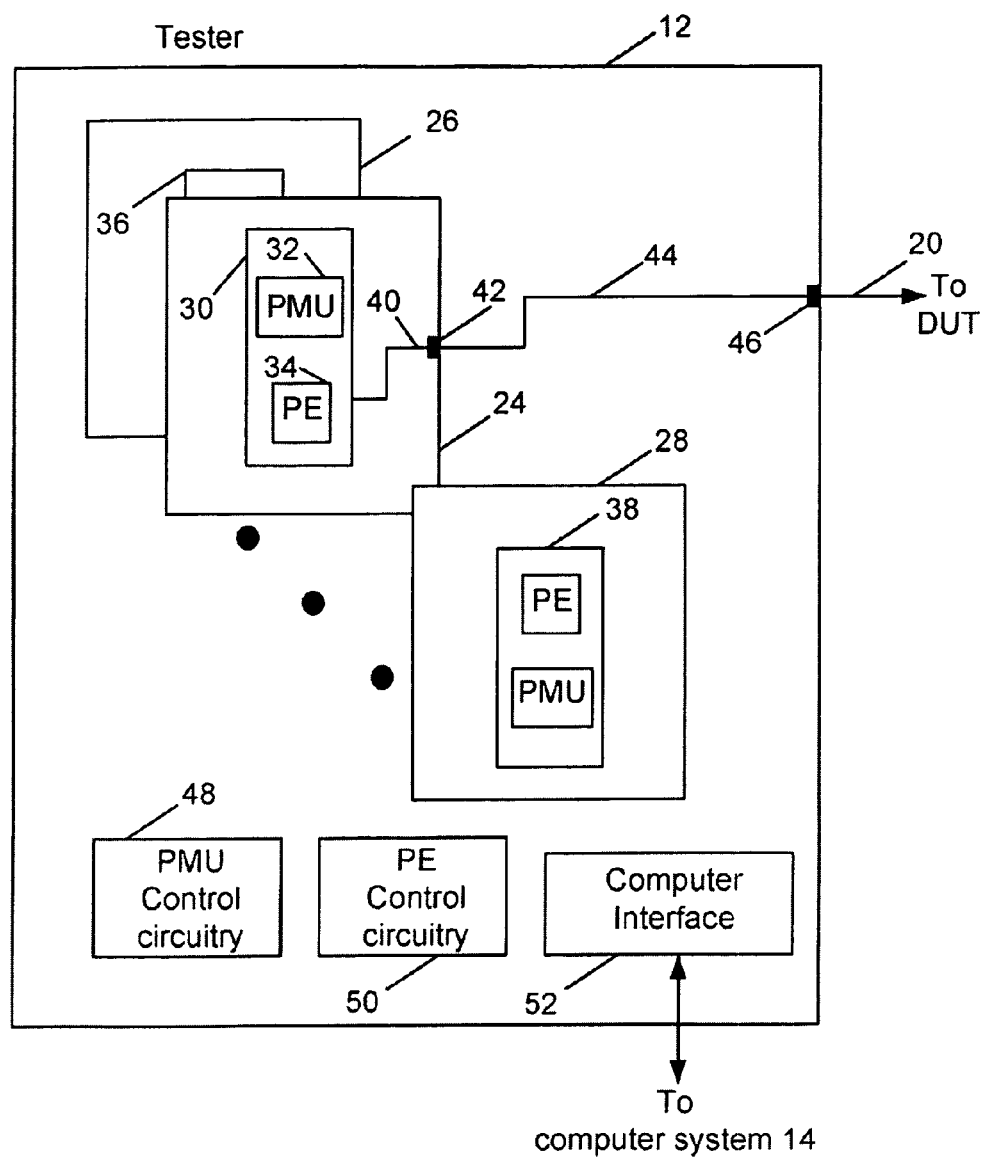
FIG. 3 is a block diagram of a tester used in the ATE.

Referring also to FIG. 3, to send and collect test signals from multiple connector pins of a DUT (or multiple DUTs), semiconductor device tester 12 includes an interface card 24 that can communicate with numerous pins. For example, interface card 24 may transmit test signals to, e.g., 32, 64, or 128 pins and collect corresponding responses. Each communication link to a pin is typically referred to as a channel and, by providing test signals to a large number of channels, testing time is reduced since multiple tests may be performed simultaneously. Along with having many channels on an interface card, by including multiple interface cards in tester 12, the overall number of channels increases, thereby further reducing testing time. In this example, two additional interface cards 26 and 28 are shown to demonstrate that multiple interface cards may populate tester 12.

Each interface card includes a dedicated integrated circuit (IC) chip (e.g., an application specific integrated circuit (ASIC)) for performing particular test functions. For example, interface card 24 includes IC chip 30 for performing parametric measurement unit (PMU) tests and pin electronics (PE) tests. IC chip 30 has a PMU stage 32 that includes circuitry for performing PMU tests and a PE stage 34 that includes circuitry for performing PE tests. Additionally, interface cards 26 and 28 respectively include IC chips 36 and 38 that include PMU and PE circuitry. Typically PMU testing involves providing a DC voltage or current signal to the DUT to determine such quantities as input and output impedance, current leakage, and other types of DC performance characterizations. PE testing involves sending AC test signals and waveforms to a DUT (e.g., DUT 18) and collecting responses to further characterize the performance of the DUT. For example, IC chip 30 may transmit, to the DUT, AC test signals that represent a vector of binary values for storing on the DUT. Once these binary values have been stored, the DUT is accessed by tester 12 to determine if the correct binary values have been stored. Since digital signals typically include abrupt voltage transitions, the circuitry in PE stage 34 on IC chip 30 operates at a relatively high speed in comparison to the circuitry in PMU stage 32.

To pass both DC and AC test signals and analog waveforms from interface card 24 to DUT 18, a conducting trace 40 connects IC chip 30 to an interface board connector 42 that allows signals to be passed on and off interface board 24. Interface board connector 42 is also connected to a conductor 44 that is connected to an interface connector 46, which allows signals to be passed to and from tester 12. In this example conductor 20 is connected to interface connector 46 for bi-directional signal passing between tester 12 and pin 22 of DUT 18. In some arrangements, an interface device may be used to connect one or more conductors from tester 12 to the DUT. For example, the DUT (e.g., DUT 18) may be mounted onto a device interface board (DIB) for providing access to each DUT pin. In such an arrangement, conductor 20 may be connected to the DIB for placing test signals on the appropriate pin(s) (e.g., pin 22) of the DUT.

In this example, only conducting trace 40 and conductor 44 respectively connect IC chip 30 and interface board 24 for delivering and collecting signals. However, IC chip 30 (along with IC chips 36 and 38) typically has multiple pins (e.g., eight, sixteen, etc.) that are respectively connected with multiple conducting traces and corresponding conductors for providing and collecting signals from the DUT (via a DIB). Additionally, in some arrangements, tester 12 may connect to two or more DIB's for interfacing the channels provided by interface cards 24, 26, and 28 to one or multiple devices under test.

To initiate and control the testing performed by interface cards 24, 26, and 28, tester 12 includes PMU control circuitry 48 and PE control circuitry 50 that provide test parameters (e.g., test signal voltage level, test signal current level, digital values, etc.) for producing test signals and analyzing DUT responses. PMU control circuitry 48 and PE control circuitry 50 may be part of one or more ICs or may be implemented via a processing device, such as a digital signal processor (DSP). Tester 12 also includes a computer interface 52 that allows computer system 14 to control the operations executed by tester 12 and also allows data (e.g., test parameters, DUT responses, etc.) passing between tester 12 and computer system 14.

Figure 4:
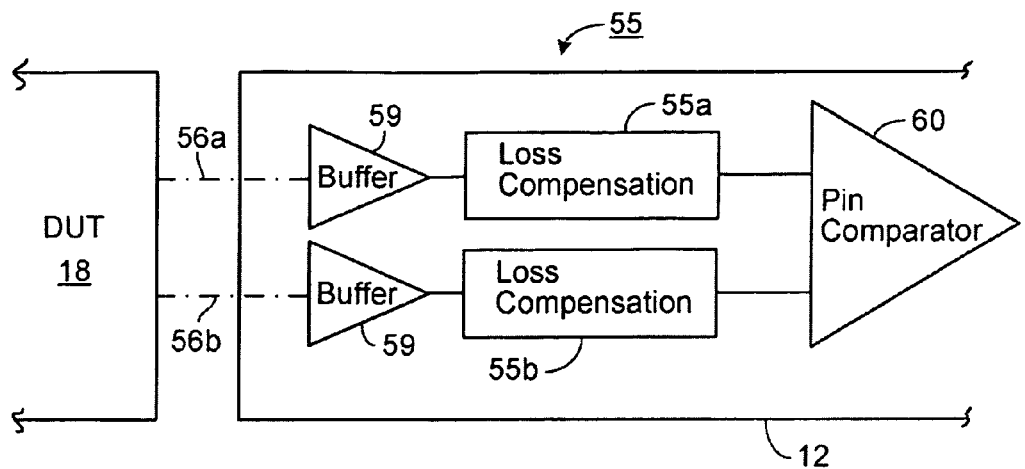
FIG. 4 is a diagram showing loss compensation circuitry in the ATE for adjustably compensating for signal losses in a transmission path between the ATE and the DUT.

FIG. 4 shows circuitry 55 that may be incorporated into ATE 12 (e.g., on an interface board or elsewhere). Circuitry 55 provides adjustable compensation for signal losses that occur in the transmission path due, e.g., to skin resistance. Circuitry 55, however, is not limited to compensating for skin losses, but rather may be used to compensate for any losses in the transmission path. In this context, "compensation" means, essentially, to reduce the effects of the loss. It does not necessarily mean to completely correct for the loss, although, in some cases, the loss may be completely, or almost completely, corrected.

FIG. 4 shows DUT 18, which provides true and complementary outputs to transmission paths 56a and 56b, respectively. Transmission paths 56a, 56b may include wiring, such as coaxial cable, between the DUT and an interface board in ATE 12. Transmission paths 56a, 56b may also include any conducting traces on the ATE and/or DUT between signal transmission and reception points. Buffers 59 may be included in transmission paths 56a, 56b to buffer transmitted signals.

Loss compensation circuits 55a and 55b compensate for losses that occur in transmission paths 56a and 56b, respectively. The structure and function of the loss compensation circuits is described below. Pin comparator 60 receives true and complementary signals from the loss compensation circuits in transmission paths 56a and 56b, and identifies data using the true and complementary signals. Specifically, pin comparator 60 detects a difference between the true and complementary signals. If the difference exceeds a predefined threshold, then the true and complementary signals are deemed to constitute a "logic one" signal. If the difference is below the predefined threshold, then the true and complementary signals are deemed to constitute a "logic zero" signal. Pin comparator 60 sends either the resulting logic one signal or logic zero signal to circuitry on the ATE for further processing.

Figure 5:
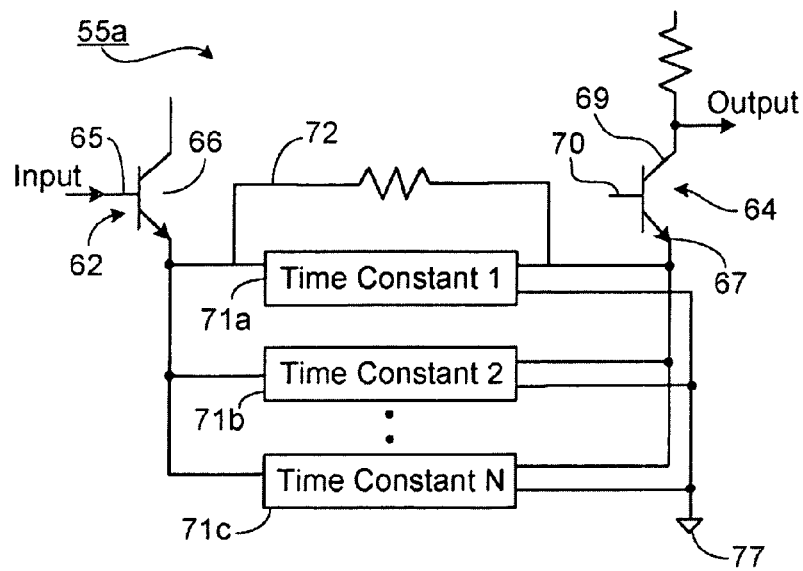
FIG. 5 is a block diagram showing time compensating circuit blocks contained in the loss compensation circuitry of FIG. 4.

Loss compensation circuits 55a and 55b are similar in structure and function. Therefore, only one loss compensation circuit 55a is described here. FIG. 5 shows circuitry included in loss compensation circuit 55a. The circuitry includes input transistor 62 and output transistor 64. In this implementation, input transistor 62 is an emitter-follower having a base 65, to which a control signal is applied in order to drive the transistor. The signal path is connected along the collector-emitter path 66 of the transistor. Output transistor 64 is also an emitter-follower transistor. Specifically, output transistor 64 is an emitter-follower transistor, in which a signal applied to emitter 67 is output at collector 69. A fixed DC signal is applied to base 70 to allow current to pass from emitter 67 to collector 69.

Loss compensation circuit 55a also includes time constant circuit blocks 71a to 71c and resistor 72 in parallel. Input transistor 66 is connected to output transistor 64 through resistor 72 to act as an amplifier, the frequency response of which is adjustable via switchable time constants in parallel with resistor 72. Loss compensation circuit 55a may include any number of time constant circuit—in one implementation, two are included (more than two are shown in FIG. 5). Each time constant circuit block introduces a time constant into the transmitted signal from transmission path 56a together, these time constants counteract time constants that are inherent in transmission path 56a (capacitance (C) and resistance (R) in transmission path 56a produce an RC time constant that compensates for signal attenuation in transmission path 56a).

Figure 6:
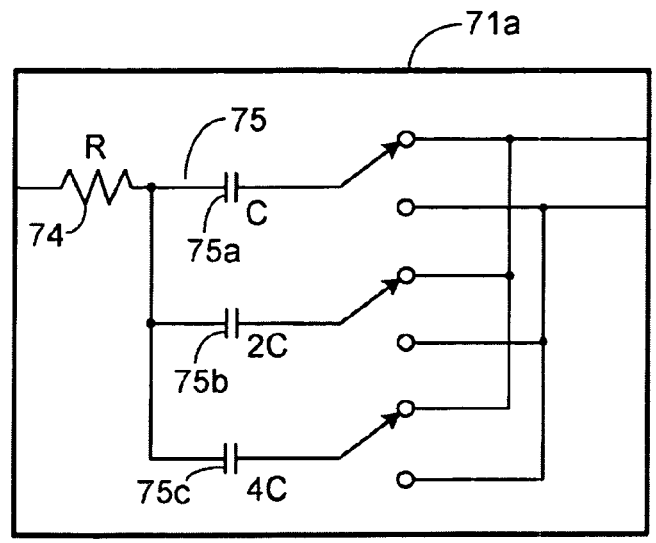
FIG. 6 is a circuit diagram showing circuitry contained in the time compensating circuit blocks of FIG. 5.

Each time constant circuit block is similar in structure and function. Accordingly, only one time constant circuit block 71a is described here. Referring to FIG. 6, time-constant circuit block 71a includes a resistive circuit 74 and a capacitive circuit 75, which are connected in series. As shown, resistive circuit 74 is a single resistor; however, resistive circuit 74 may be implemented using more than one resistor (e.g., a resistive network) and/or one or more additional electronic components. Capacitive circuit 75 includes three binary-weighted capacitors 75a, 75b, 75c, which are connected in parallel. It is noted that more, or less, than three capacitors may be used. In addition, other circuit elements that provide capacitance may be included in capacitive circuit 75.

Capacitors 75a to 75c have capacitances (C) of C (for capacitor 75a), 2C (for capacitor 75b) and 4C (for capacitor 75c). Accordingly, the time constant produced by time constant circuit block is 7RC, i.e., the equivalent capacitance of capacitors 75a to 75c—namely 7C—multiplied by the resistance of resistive circuit 74 (R). Capacitors 75a to 75c may be switched to either emitter 67 or ground 77 in order to control the amount of current being combined at emitter 67 and thus the amount of loss compensation provided by time constant circuit block 71a. The time constant provided by each block, however, does not change as the capacitors are always connected to either to emitter 67 or ground 77.

Specifically, as shown in FIGS. 5 and 6, when a capacitor 75a to 75c is switched to connect to emitter 67, current passes through the capacitor to the output transistor 64. When a capacitor is switched out, the current passes to ground 77 (or, e.g., another type of shunt circuit—not shown). The more current that is permitted to pass through to transistor 64, the greater the compensation will be for transmission path loss. Care should be taken not to allow too much current to pass and thereby provide overcompensation for the signal loss.

Figure 7:
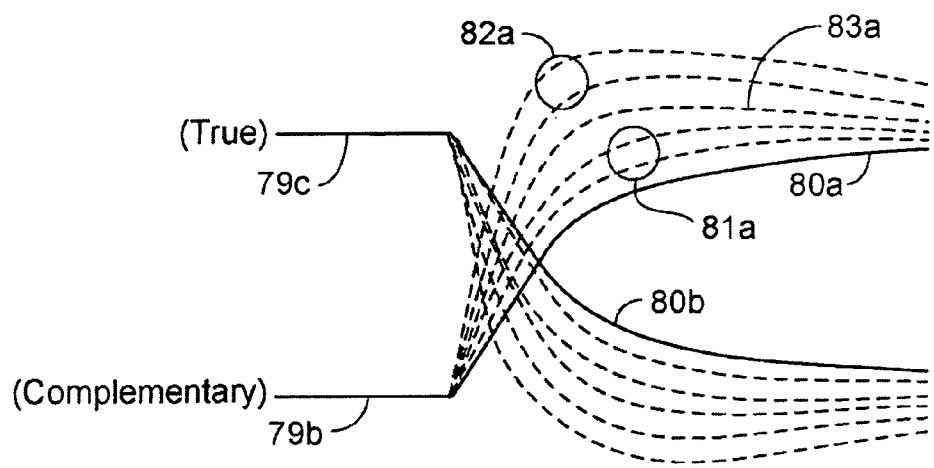
FIG. 7 is a graph showing the effects of loss compensation on signals.

FIG. 7 shows original true 79a and complementary 79b high-speed digital signals transmitted from the DUT to the ATE via transmission paths 56a and 56b, respectively. Signal 80a is the uncompensated signal (i.e., with loss) that corresponds to original true signal 79a. Signal 80b is the uncompensated signal that corresponds to complementary signal 79b. FIG. 7 shows the effects of varying amounts of compensation on signals 80a and 80b. As shown in FIG. 7, for signal 80a, waveforms 81a correspond to under-compensation, i.e., not enough capacitors switched into the transmission path. Waveforms 82a correspond to over-compensation, i.e., too many capacitors switched into the transmission path. Waveform 83a corresponds to about a right amount of compensation, since it most closely approximates the original true signal 79a.

The amount of compensation required for a particular length of a transmission media may be stored it memory on the ATE, along with configurations of the time constant circuit blocks needed to compensate for losses resulting from that length of transmission media. Prior to operation, loss compensation circuits may be configured accordingly. Alternatively, prior to operation, the amount of loss may be measured, and the loss compensation circuits configured appropriately to compensate for the loss.

The process described herein that is performed by the loss compensation circuits to compensate for loss in transmission media (hereinafter, "the loss compensation process") can be implemented, at least in part, via a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. For example, the control signals applied to input transistor 62 and output transistor 64 may be computer-controlled.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing the loss compensation process can be performed by one or more programmable processors executing one or more computer programs to perform the functions of the calibration process. All or part of the loss compensation process can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

Circuitry to implement the loss compensation is not limited to the specific examples described herein. For example, while this disclosure describes circuitry within ATE, the circuitry and process described herein may be used in any circuit environment that experiences signal losses in a transmission path.

Elements of different embodiments described herein may be combined to form other embodiments not specifically set forth above. Other embodiments not specifically described herein are also within the scope of the following claims.

What is claimed is:

1. An apparatus to compensate for loss in a transmission path, comprising:
    a circuit block to incorporate a time constant into a signal transmitted via the transmission path, the time constant for counteracting at least part of inherent time constants that contribute to loss in the transmission path;
    wherein the circuit block comprises:
        a resistive circuit; and
        a capacitive circuit, the capacitive circuit and the resistive circuit together contributing to the time constant, the capacitive circuit comprising plural capacitors that are each switchable;
        wherein an amount of compensation provided by the apparatus corresponds, at least in part, to the loss in the transmission path; and
    a first emitter-follower transistor connected to the circuit block and connected through a gain resistor to another emitter-follower transistor to act as a amplifier, a frequency response of the amplifier being adjustable via time constants that are switchable in parallel with the gain resistor.

2. The apparatus of claim 1, wherein the circuit block is a first circuit block and the time constant introduced by the first circuit block is a first time constant; and
    wherein the apparatus further comprises:
        N (N≧1) circuit blocks, each of the N circuit blocks introducing an $N^{th}$ time constant, wherein the first time constant and N time constant(s) together counteract at least part of the inherent time constants;
        wherein an $M^{th}(1 \leq M \leq N)$ circuit block comprises:
            an $M^{th}$ resistive circuit; and
            an $M^{th}$ capacitive circuit, the $M^{th}$ capacitive circuit and the $M^{th}$ resistive circuit together contributing to an $M^{th}$ time constant introduced by the $M^{th}$ circuit block, the $M^{th}$ capacitive circuit comprising plural capacitors that are each switchable.

3. The apparatus of claim 1, wherein the plural capacitors comprise binary-weighted capacitors arranged in parallel, the binary-weighted capacitors being switchable between an output transistor and ground.

4. The apparatus of claim 3, wherein the binary-weighted capacitors comprise three binary-weighted capacitors, a first of the binary-weighted capacitors having a capacitance of C, a second of the binary-weighted capacitors having a capacitance of 2C, and a third of the binary-weighted capacitors having a capacitance of 4C.

5. The apparatus of claim 1, wherein the resistive circuit and the capacitive circuit are connected in series.

6. The apparatus of claim 1, wherein the resistive circuit comprises a resistors and the capacitive circuit comprises capacitors connected in parallel.

7. The apparatus of claim 1, wherein the transmission path is comprised of one or more of a trace on a circuit board and wiring that is not part of the circuit board.

8. The apparatus of claim 1, wherein the loss in the transmission path causes rounding of peaks and timing errors in the signal transmitted along the transmission path; and
    wherein the compensation provided by the apparatus counteracts the rounding and timing errors at least partially.

9. The apparatus of claim 1, wherein the transmission path comprises at least part of a signal path between automatic test equipment (ATE) and a device under test (DUT).

10. A method of compensating for loss in a transmission path, comprising:
    introducing a time constant via a loss compensation circuit, the introduced time constant counteracting at least part of a time constant inherent in the transmission path; the introduced time constant being defined, at least in part, by a resistive circuit and a capacitive circuit in the loss compensation circuit, the capacitive circuit comprising plural capacitors that are each switchable; and
    wherein introducing the time constant comprises switching any combination of the plural capacitors via the loss compensation circuit;
    wherein an amount of compensation provided by the method corresponds, at least in part, to an amount of loss in the transmission path;
    wherein the plural capacitors comprise binary-weighted capacitors arranged in parallel, the binary-weighted capacitors being switchable between the loss compensation circuit and ground; and
    wherein the binary-weighted capacitors comprise three binary-weighted capacitors, a first of the binary-weighted capacitors having a capacitance of C, a second of the binary-weighted capacitors having a capacitance of 2C, and a third of the binary-weighted capacitors having a capacitance of 4C.

11. The method of claim 10, further comprising:
introducing additional time constants into the transmission path, the additional time constants being defined, at least in part, by plural resistive circuits and plural capacitive circuits incorporated into the loss compensation circuit, each of the plural capacitive circuits comprising plural capacitors that are each switchable via the loss compensation circuit.

12. The method of claim 10, wherein the resistive circuit and the capacitive circuit are connected in series within the loss compensation circuit.

13. The method of claim 12, wherein the resistive circuit comprises a resistor.

14. The method of claim 10, wherein the transmission path comprises one or more of a trace on a circuit board and wiring that is not part of the circuit board.

15. The method of claim 10, wherein the loss in the transmission path causes rounding of peaks and timing errors in a signal transmitted along the transmission path; and
wherein the compensation provided by the method counteracts the rounding and timing errors at least partially.

16. The method of claim 10, further comprising:
switching the introduced time constant into the loss compensation circuit via first and second transistors, the second transistor comprising an emitter-follower transistor, the emitter-follower transistor passing a loss-compensated signal from an emitter to a collector.

17. The method of claim 10, wherein the transmission path comprises at least part of a signal path between automatic test equipment (ATE) and a device under test (DUT).

18. An apparatus to compensate for loss in a transmission path, comprising:
a circuit block that incorporates a time constant into a signal transmitted via the transmission path, the time constant counteracting at least part of inherent time constants that contribute to loss in the transmission path;
wherein tue circuit block comprises:
a resistive circuit; and
a capacitive circuit, the capacitive circuit and the resistive circuit together contributing to the time constant, the capacitive circuit comprising plural capacitors that are each switchable;
wherein an amount of compensation provided by the apparatus
corresponds, at least in part, to the loss in the transmission path;
wherein the plural capacitors comprise binary-weighted capacitors arranged in parallel, the binary-weighted capacitors being switchable between an output transistor and ground; and
wherein the binary-weighted capacitors comprise three binary-weighted capacitors, a first of the binary-weighted capacitors having a capacitance of C, a second of the binary-weighted capacitors having a capacitance of 2C, and a third of the binary-weighted capacitors having a capacitance of 4C.

19. The apparatus of claim 18, wherein the circuit block is a first circuit block and the time constant introduced by the first circuit block is a first time constant; and
wherein the apparatus further comprises:
N (N≧1) circuit blocks, each of the N circuit blocks introducing an $N^{th}$ time constant, wherein the first time constant and N time constant(s) together counteract at least part of the inherent time constants;
wherein an $M^{th}$ (1≦M≦N) circuit block comprises:
an $M^{th}$ resistive circuit; and
an $M^{th}$ capacitive circuit, the $M^{th}$ capacitive circuit and the $M^{th}$ resistive circuit together contributing to an $M^{th}$ time constant introduced by the $M^{th}$ circuit block, the $M^{th}$ capacitive circuit comprising plural capacitors that are each switchable.

20. The apparatus of claim 18, wherein the resistive circuit and the capacitive circuit are connected in series.

21. The apparatus of claim 20, wherein the resistive circuit comprises a resistor.

22. The apparatus of claim 18, wherein the transmission path is comprised of one or more of a trace on a circuit board and wiring that is not part of the circuit board.

23. The apparatus of claim 18, wherein the loss in the transmission path causes rounding of peaks and timing errors in the signal transmitted along the transmission path; and
wherein the compensation provided by the apparatus counteracts the rounding and timing errors at least partially.

24. The apparatus of claim 23, further comprising:
a first emitter-follower transistor connected to the circuit block and connected through a gain resistor to another emitter-follower to act as a amplifier, a frequency response of the amplifier being adjustable via time constants that are switchable in parallel with the gain resistor.

25. A method of compensating for loss in a transmission path, comprising:
introducing a first time constant via a loss compensation circuit, the first time constant counteracting at least part of a time constant in the transmission path, the first time constant being defined, at least in part, by a first resistive-capacitive circuit in the loss compensation circuit, the first resistive-capacitive circuit comprising first plural capacitors that are each switchable into the transmission path;
wherein introducing the first time constant comprises switching any combination of the first plural capacitors into the transmission path via the loss compensation circuit;
introducing a second time constant via the loss compensation circuit, the second time constant counteracting at least part of a time constant inherent in the transmission path, the second time constant being defined, at least in part, by a second-resistive circuit in the loss compensation circuit, the second resistive-capacitive circuit comprising second plural capacitors that are each switchable into the transmission path;
wherein introducing the second time constant comprises switching any combination of the second plural capacitors into the transmission path via the loss compensation circuit; and
wherein an amount of compensation provided by the method corresponds, at least in part, to an amount of loss in the transmission path.

26. The method of claim 25, wherein the first and second resistive-capacitive circuits are connected in parallel within the loss compensation circuit.

27. The method of claim 25, wherein the first and second resistive-capacitive circuits comprise resistors.

28. The method of claim 25, wherein the transmission path comprises one or more of a trace on a circuit board and writing that is not part of the circuit board.

29. The method of claim 25, wherein the loss in the transmission path causes rounding of peaks and timing errors in a signal transmitted along the transmission path; and
wherein the compensation provided by the method counteracts the rounding and timing errors at least partially.

30. The method of claim 25, further comprising:
switching the first and second time constants into the loss compensation circuit via first and second transistors, the second transistor comprising an emitter-follower transistor, the emitter-follower transistor passing a loss-compensated signal from an emitter to a collector.

31. The method of claim 25, wherein the transmission path comprises at least part of a signal path between automatic test equipment (ATE) and a device under test (DUT).

32. An apparatus to compensate for loss in a transmission path, comprising:
a first circuit block to incorporate a first time constant into a signal transmitted via the transmission path, the first time constant for counteracting at least part of inherent time constants that contribute to loss in the transmission path;
wherein the first circuit block comprises:
a first resistive circuit; and
a first capacitive circuit, the first capacitive circuit and the first resistive circuit together contributing to the first time constant, the first capacitive circuit comprising first plural capacitors that are each switchable into the transmission path;
a second circuit block to incorporate a second time constant into the signal transmitted via the transmission path, the second time constant for counteracting at least part of inherent time constants that contribute to loss in the transmission path;
wherein the second circuit block comprises:
a second resistive circuit; and
a second capacitive circuit, the second capacitive circuit and the second resistive circuit together contributing to the second time constant, the second capacitive circuit comprising second plural capacitors that are each switchable into the transmission path;
wherein an amount of compensation provided by the apparatus corresponds, at least in part, to the loss in the transmission path.

33. The apparatus of claim 32, wherein the apparatus further comprises:
N (N≧1) circuit blocks, each of the N circuit blocks introducing an $N^{th}$ time constant, wherein the first time constant, the second time constant, and N time constant(s) together counteract at least part of the inherent time constants;
wherein an $M^{th}$ (1≦M≦N) circuit block comprises:
an $M^{th}$ resistive circuit; and
an $M^{th}$ capacitive circuit, the $M^{th}$ capacitive circuit and the $M^{th}$ resistive circuit together contributing to an $M^{th}$ time constant introduced by the $M^{th}$ circuit block, the $M^{th}$ capacitive circuit comprising plural capacitors that are each switchable.

34. The apparatus of claim 32, wherein the first and second plural capacitors comprise binary-weighted capacitors each arranged in parallel, the binary-weighted capacitors being switchable between an output transistor and ground.

35. The apparatus of claim 34, wherein the binary-weighted capacitors comprise three binary-weighted capacitors, a first of the binary-weighted capacitors having a capacitance of C, a second of the binary-weighted capacitors having a capacitance of 2C, and a third of the binary-weighted capacitors having a capacitance of 4C.

36. The apparatus of claim 32, wherein the first and second resistive circuits and the first and second capacitive circuits are respectively connected in series.

37. The apparatus of claim 36, wherein each of the first and second resistive circuits comprises a resistor and each of the first and second capacitive circuits comprises capacitors connected in parallel.

38. The apparatus of claim 32, wherein the transmission path is comprised of one or more of a trace on a circuit board and wiring that is not part of the circuit board.

39. The apparatus of claim 32, wherein the loss in the transmission path causes rounding of peaks and timing errors in the signal transmitted along the transmission path; and
wherein the compensation provided by the apparatus counteracts the rounding and timing errors at least partially.

40. The apparatus of claim 32, further comprising:
a first emitter-follower transistor connected to the first and second circuit blocks and connected through a gain resistor to another emitter-follower transistor to act as a amplifier, a frequency response of the amplifier being adjustable via time constant that are switchable in parallel with the gain resistor.

41. The apparatus of claim 32, wherein the transmission path comprises at least part of a signal path between automatic test equipment (ATE) and a device under test (DUT).

* * * * *